United States Patent
Wu et al.

(10) Patent No.: US 12,424,593 B2
(45) Date of Patent: Sep. 23, 2025

(54) ELECTRONIC DEVICE

(71) Applicant: Innolux Corporation, Miaoli County (TW)

(72) Inventors: Ming-Tsang Wu, Miaoli County (TW); Jia-Sin Li, Miaoli County (TW); Chia-Chieh Fan, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 0 days.

(21) Appl. No.: 18/527,392

(22) Filed: Dec. 4, 2023

(65) Prior Publication Data

US 2024/0103308 A1 Mar. 28, 2024

Related U.S. Application Data

(63) Continuation of application No. 17/701,693, filed on Mar. 23, 2022, now Pat. No. 11,880,100.

(Continued)

(30) Foreign Application Priority Data

Dec. 17, 2021 (CN) .......................... 202111556454.3

(51) Int. Cl.
*G02F 1/1333* (2006.01)
*H01L 25/075* (2006.01)
(Continued)

(52) U.S. Cl.
CPC .... *H01L 25/0753* (2013.01); *G02F 1/133305* (2013.01); *H01L 25/167* (2013.01);
(Continued)

(58) Field of Classification Search
CPC ........ G02F 1/133305; G02F 1/133603; G02F 2201/50; G09F 9/301; H10K 77/111;
(Continued)

(56) References Cited

U.S. PATENT DOCUMENTS

2015/0123102 A1* 5/2015 Jeon ........................ H10K 59/12
257/40
2016/0254500 A1* 9/2016 Kawata ............... H02J 7/00302
362/157

(Continued)

FOREIGN PATENT DOCUMENTS

WO 2021003743 1/2021
WO WO-2021003743 A1 * 1/2021

OTHER PUBLICATIONS

"Office Action of Taiwan Counterpart Application", issued on Dec. 31, 2024, p. 1-p. 5.

*Primary Examiner* — Jia X Pan
(74) *Attorney, Agent, or Firm* — JCIPRNET

(57) ABSTRACT

An electronic device including a substrate, a circuit structure, two adjacent supporting elements and another two adjacent supporting elements is provided. The flexible substrate has a first surface and comprises a region connected with a circuit board. The circuit structure is disposed on the first surface. The two adjacent supporting elements are disposed on the first surface and separated by a first distance. The another two adjacent supporting elements are disposed on the first surface and separated by a second distance, wherein the two adjacent support elements are farther away from the region than the another two adjacent support elements, and the first distance is less than the second distance.

11 Claims, 9 Drawing Sheets

Related U.S. Application Data

(60) Provisional application No. 63/177,962, filed on Apr. 22, 2021.

(51) Int. Cl.
    *H01L 25/16*     (2023.01)
    *H10K 102/00*     (2023.01)

(52) U.S. Cl.
    CPC ............... *G02F 2201/50* (2013.01); *H05K 2201/10106* (2013.01); *H10K 2102/311* (2023.02)

(58) Field of Classification Search
    CPC ............ H10K 2102/311; H10K 50/841; G06F 1/1652; G06F 2203/04102; H01L 25/0753; H01L 27/016; H01L 25/167; H05K 2201/10106
    See application file for complete search history.

(56) References Cited

U.S. PATENT DOCUMENTS

| | | | |
|---|---|---|---|
| 2019/0013493 A1* | 1/2019 | Sonoda | H10K 50/841 |
| 2019/0041701 A1* | 2/2019 | Chen | G02F 1/133617 |
| 2020/0295113 A1* | 9/2020 | Lee | H05K 1/147 |

\* cited by examiner

ELECTRONIC DEVICE

CROSS-REFERENCE TO RELATED APPLICATION

This application is a continuation application of and claims the priority benefit of a prior application Ser. No. 17/701,693, filed on Mar. 23, 2022, which claims the priority benefit of U.S. provisional application Ser. No. 63/177,962, filed on Apr. 22, 2021 and China application serial no. 202111556454.3, filed on Dec. 17, 2021. The entirety of each of the above-mentioned patent applications is hereby incorporated by reference herein and made a part of this specification.

BACKGROUND

Technical Field

The disclosure relates to an electronic device.

Description of Related Art

Along with technology advancement of modern electronic products, electronic devices on the market already come with foldable function and/or rollable function. To achieve the functions, an electronic device usually has a relatively thin thickness. However, the electronic device is subjected to deformation under the action of internal stress or external stress, which may cause damages to the electronic components therein.

SUMMARY

The disclosure relates to an electronic device, which is adapted to mitigate deformation after a stress effect.

An embodiment of the disclosure provides an electronic device including a substrate, a circuit structure, two adjacent supporting elements and another two adjacent supporting elements. The flexible substrate has a first surface and comprises a region connected with a circuit board. The circuit structure is disposed on the first surface. The two adjacent supporting elements are disposed on the first surface and separated by a first distance. The another two adjacent supporting elements are disposed on the first surface and separated by a second distance, wherein the two adjacent support elements are farther away from the region than the another two adjacent support elements, and the first distance is less than the second distance.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
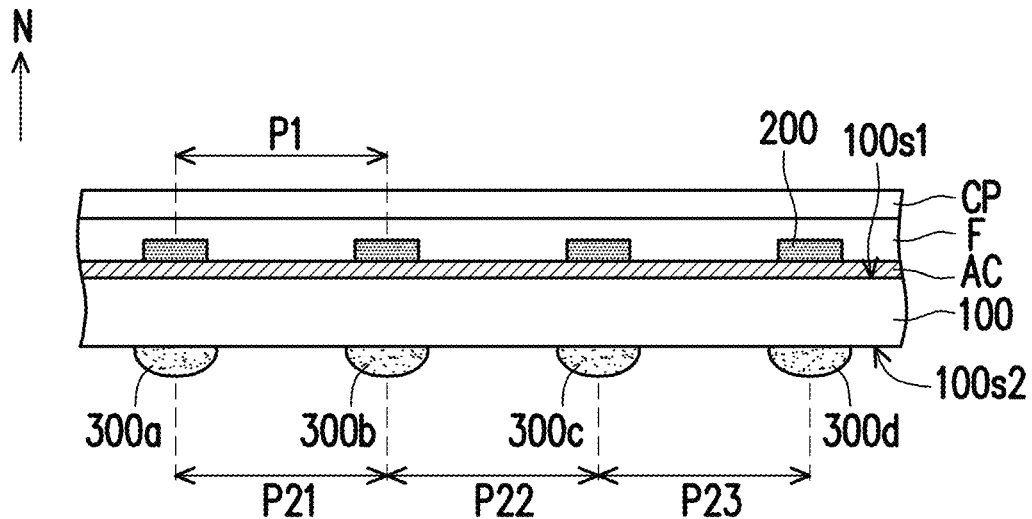
FIG. 1 is a schematic partial cross-sectional view of an electronic device according to a first embodiment of the disclosure.

The disclosure may be understood by referring to the following detailed description with reference of the accompanying drawings. It should be noted that, in order to facilitate the reader's understanding and the conciseness of the drawings, the multiple drawings in the disclosure only depict a part of an electronic device, and specific elements in the drawings are not drawn according to actual scales. In addition, the number and size of each element in the figures are only for illustration, and are not used to limit the scope of the disclosure.

Throughout the specification and claims of the disclosure, certain words are used to refer to specific elements. Those skilled in the art should understand that electronic device manufacturers may refer to the same elements by different names. This specification does not intend to distinguish those elements with the same function but different names. In the following description and claims, the words "have" and "include" are open-ended words, so they should be interpreted as "including but not limited to . . . ". Therefore, when the terms "including", "containing" and/or "having" are used in the description of the disclosure, they specify the presence of corresponding features, regions, steps, operations and/or components, but do not preclude the presence of one or more other features, regions, steps, operations, and/or components.

Directional terminology used in the specification, such as "top," "bottom," "front," "back," "left," "right," etc., are used with reference to the orientation of the Figure(s) being described. Therefore, the used directional terms are used to illustrate, not to limit the disclosure. In the drawings, each drawing shows the general features of the methods, structures, and/or materials used in a specific embodiment. However, these drawings should not be construed as defining or limiting the scope or nature covered by these embodiments.

For example, for clarity's sake, relative size, thickness and position of each film layer, region and/or structure may be reduced or enlarged.

When a corresponding component (such as a film layer or a region) is referred to as being "on another component", the component may be directly on the other component, or there may be other components between the two components. On the other hand, when a component is referred as being "directly on another component", there is no other component between the two components. In addition, when a component is referred to as being "on another component", the two components have a vertical relationship in a top view direction, and the component may be located above or below the other component, and this vertical relationship depends on an orientation of the device.

The terms "about", "equal to", "equal" or "same", "substantially" or "approximately" are generally interpreted as being within 20% of a given value or range, or interpreted as being within 10%, 5%, 3%, 2%, 1%, or 0.5% of the given value or range.

The ordinal numbers used in the specification and claims, such as "first", "second", etc., are used to modify components, and do not imply and represent that the component or these components have any previous ordinal numbers, and do not represent a sequence of one component with another, or a sequence in a manufacturing method. The use of these ordinal numbers is only to make a clear distinction between a component with a certain name and another component with the same name. The same terms may not be used in the claims and the specification, and accordingly, a first component in the specification may be a second component in the claims.

It should be noted that in the following embodiments, features in a plurality of different embodiments may be substituted, reorganized, and mixed to complete other embodiments without departing from the spirit of the present disclosure. The features of the various embodiments may be mixed and matched arbitrarily as long as they do not violate or conflict with the spirit of the disclosure.

The electrical connection or coupling described in this disclosure may refer to direct connection or indirect connection. In the case of direct connection, terminals of components on two circuits are directly connected or connected to each other by a conductor line segment, and in the case of indirect connection, there are switches, diodes, capacitors, inductors, other suitable components, or a combination of the above components between the terminals of the components on the two circuits, but the disclosure is not limited thereto.

In the disclosure, a thickness, length, width, and area may be measured by using an optical microscope, and the thickness may be obtained by measuring a cross-sectional image in the electron microscope, but the disclosure is not limited thereto. In addition, there may be a certain error in any two values or directions used for comparison. If a first value is equal to a second value, it implies that there may be an error of about 10% between the first value and the second value; if a first direction is perpendicular to a second direction, an angle between the first direction and the second direction may be between 80 degrees and 100 degrees; and if the first direction is parallel to the second direction, the angle between the first direction and the second direction may be between 0 degree and 10 degrees.

An electronic device of the disclosure may include functions of display, antenna, light-emitting, sensing, touch control, splicing, other suitable functions, or a combination of the above functions, but the disclosure is not limited thereto. The electronic device includes a rollable or flexible electronic device, but the disclosure is not limited thereto. The electronic device may, for example, include diodes, liquid crystal, light-emitting diodes (LEDs), quantum dots (QDs), fluorescence, phosphor, other suitable materials, or a combination of the above materials. The LED may include, for example, an organic light-emitting diode (OLED), a micro-LED (mini-LED), or a quantum dot light-emitting diode (QLED, QDLED), but the disclosure is not limited thereto. Hereinafter, a display device or a splicing device is taken as an example to serve as the electronic device to describe the content of the disclosure, but the disclosure is not limited thereto.

FIG. 1 is a schematic partial cross-sectional view of an electronic device according to a first embodiment of the disclosure.

Referring to FIG. 1, an electronic device 10a of the embodiment includes a flexible substrate 100, a plurality of light emitting units 200, and a plurality of supporting elements 300.

A material of the flexible substrate 100 may include, for example, polymethyl methacrylate (PMMA), polycarbonate (PC), polyimide (PI), polyethylene terephthalate (PET) or other suitable materials or a combination of the above materials, but the disclosure is not limited thereto. In some embodiments, the flexible substrate 100 has a first surface 100s1 and a second surface 100s2 opposite to each other. The first surface 100s1 of the flexible substrate 100 may be used to, for example, configure an element layer AC including components such as a circuit structure (not shown), etc., and the second surface 100s2 of the flexible substrate 100 may be used to, for example, configure a functional layer including a support layer and/or a heat dissipation layer, but the disclosure is not limited thereto. In the embodiment, a plurality of light emitting units 200 are disposed on the first surface 100s1 of the flexible substrate 100, and a plurality of supporting elements 300 are disposed on the second surface 100s2 of the flexible substrate 100. The light emitting units 200 are, for example, disposed on the first surface 100s1 of the flexible substrate 100, and disposed on the first surface 100s1 of the flexible substrate 100 in an array arranged, a staggered arrangement (for example, a pentile mode) or other methods, but the disclosure is not limited thereto. In some embodiments, adjacent light emitting units of the light emitting units 200 have pitches P1 that are substantially equal to each other, but the disclosure is not limited thereto. The abovementioned pitch P1 may be a distance between centers of two adjacent light emitting units 200; or may be, for example, a distance between corresponding edges of two adjacent light emitting units 200, which is not limited by the disclosure. In some embodiments, the light emitting units 200 may be, for example, disposed on the aforementioned element layer AC. The element layer AC may include a circuit structure (not shown) to drive the light emitting units 200. For example, the element layer AC may include a plurality of scan lines, a plurality of data lines, an insulating layer, a capacitor, a plurality of transistors, and/or a plurality of electrodes, etc., but the disclosure is not limited thereto. In some embodiments, the element layer AC may include a plurality of lines without including transistors. In addition, in some embodiments, the light emitting units 200 may be electrically connected to the element layer AC through conductive pads (not shown), but the disclosure is not limited thereto. In the embodiment, the light emitting units 200 includes a plurality of light-emitting elements, which may emit various suitable color light (such as red light, green light, blue light, white light, etc.) or UV light, but the disclosure is not limited thereto. In some embodiments, the light emitting units 200 may include a self-luminous material. For example, the light emitting units 200 may include diodes, organic light-emitting diodes (OLEDs), inorganic light-emitting diodes (LEDs), such as mini LEDs or micro LEDs, quantum dots (QDs), quantum dot light-emitting diodes (QLEDs, QDLEDs), fluorescence, phosphor, other suitable materials or a combination of the above materials, but the disclosure is not limited thereto, a size of the light emitting units 200 may be adjusted according to actual requirements. In some embodiments, the light emitting units 200 may include non-self-luminous materials, such as liquid crystal molecules, electrophoretic display media, or other applicable media. The liquid crystal molecules are liquid crystal molecules that may be rotated or switched by a vertical electric field or liquid crystal molecules that may be rotated or switched by a lateral electric field, but the disclosure is not limited thereto. In some embodiments, the electronic device 10a further includes a filling layer F. The filling layer F is, for example, disposed on the first surface 100s1 of the flexible substrate 100 and covers the light emitting units 200. For example, the filling layer F is not only provided on the light emitting units 200, but is also located adjacent to or surrounds the light emitting units 200. Therefore, the filling layer F may be used to, for example, fix or protect the light emitting units 200. In some embodiments, the filling layer F includes a transparent material, and a non-transparent material. For example, the material of the filling layer F may include epoxy resin, acrylic, other suitable materials, or a combination of the above materials. In some embodiments, the filling layer F may include a single layer structure or a composite layer structure, but the disclosure is not limited thereto. It should be noted that in the embodiment, although multiple light emitting units 200 including multiple light-emitting elements is taken as an example for description, it does not mean that the disclosure may only be applied to the electronic device 10a that includes multiple light-emitting elements, i.e., the electronic device 10a of the disclosure may also be an antenna device, a sensing device, or a splicing device, etc.

The supporting elements 300 may be selectively disposed on the first surface 100s1 or the second surface 100s2 of the flexible substrate 100; or, the supporting elements 300 may be disposed on the first surface 100s1 and the second surface 100s2 of the flexible substrate 100, which is not limited by the disclosure. In the embodiment, the supporting elements 300 are disposed on the second surface 100s2 of the flexible substrate 100. However, the disclosure is not limited thereto. In some embodiments, the supporting elements 300 are disposed on the first surface 100 s1 of the flexible substrate 100. In some embodiments, the supporting elements 300 may be disposed on the first surface 100s1 and the second surface 100s2 of the flexible substrate 100. In the embodiment, at least one of the supporting elements 300 is at least partially overlapped with one of the light emitting units 200 in a normal direction N of the flexible substrate 100, but the disclosure does is not limited thereto. In some embodiments, at least one of the supporting elements 300 may not be overlapped with one of the light emitting units 200 in the normal direction N of the flexible substrate 100. In the embodiment, the supporting elements 300 include a single-layer structure, but the disclosure is not limited thereto. In some embodiments, the supporting elements 300 may include a multilayer structure. In some embodiments, adjacent supporting elements in the supporting elements 300 have an equal pitch P2. The above pitch P2 may be a distance between centers of the adjacent supporting elements 300; or may be a distance between corresponding edges of the adjacent supporting elements 300, which is not limited by the disclosure. For example, as shown in FIG. 1, a pitch P21 between a supporting element 300a and a supporting element 300b, a pitch P22 between the supporting element 300b and a supporting element 300c, and a pitch P23 between the supporting element 300c and a supporting element 300d are substantially equal to each other, but the disclosure is not limited thereto. In some embodiments, the adjacent supporting elements in the supporting elements 300 may have unequal pitches P2. In the embodiment, the pitch P2 between adjacent supporting elements in the supporting elements 300 may be an integer multiple of the pitch P1 between the adjacent light emitting units in the light emitting units 200. In detail, the pitch P2 between the adjacent supporting elements 300 and the pitch P1 between the adjacent light emitting units 200 may have a following relationship: P2: P1=n:1, where n is a positive integer. For example, in the embodiment shown in FIG. 1, the adjacent supporting elements 200 have the equal pitch P2, and the pitch P2 may be 1 times (n=1) of the pitch P1 between the adjacent light emitting units 200, where n is a fixed positive integer. It should be noted that although n=1 is used as an example for description, it does not mean that the relational expression between the pitch P2 and the pitch P1 of the disclosure may only be applied to the situation of n=1, i.e., in the relational expression between the pitch P2 and the pitch P1 of the disclosure, n may also be a positive integer other than 1. In addition, a size of the supporting element 300 of the disclosure is not particularly limited. In some embodiments, the size of the supporting element 300 is determined by a size of the light emitting unit 200, but the disclosure is not limited thereto.

In some embodiments, the supporting elements 300 may be formed on the second surface 100s2 of the flexible substrate 100 through a suitable process such as a glue dispensing process, a coating process, or a printing process, which is not limited by the disclosure. A material of the supporting elements 300 may be, for example, an organic material or an inorganic material, which is not limited by the disclosure. For example, the material of the supporting elements 300 may be, for example, glue. However, the material of the supporting elements 300 may also be, for example, a light-sensitive material, a heat-sensitive material, other suitable materials, or a combination of the above materials, which is not limited by the disclosure.

In some embodiments, the electronic device 10a may further include a cover plate CP, an antistatic layer, etc. The cover plate CP is, for example, disposed on the filling layer F and at least partially covers the light emitting units 200, which may reduce influence of external environment on the internal components of the electronic device 10a. The antistatic layer may be disposed on the filling layer F, which may reduce influence of static electricity (ESD) on the internal components of the electronic device 10a.

Figure 2:
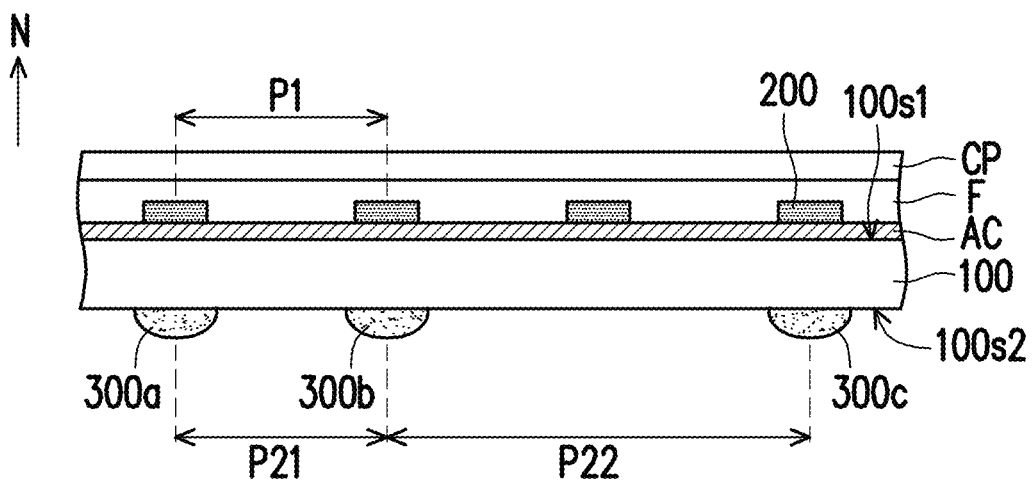
FIG. 2 is a schematic partial cross-sectional view of an electronic device according to a second embodiment of the disclosure.

FIG. 2 is a schematic partial cross-sectional view of an electronic device according to a second embodiment of the disclosure. It should be noted that the embodiment of FIG. 2 may adopt the component referential numbers and a part of the content of the embodiment of FIG. 1, where the same or similar reference numerals are used to represent the same or similar components, and description of the same technical content is omitted.

One of the differences between an electronic device 10b of FIG. 2 and the aforementioned electronic device 10a is that the adjacent supporting elements 300 may have unequal pitches P2. In detail, in the electronic device 10b shown in FIG. 2, the adjacent supporting element 300a and supporting element 300b have a pitch P21, and the adjacent supporting element 300b and supporting element 300c have a pitch P22, where the pitch P21 is smaller than the pitch P22. Although the pitch P21 and the pitch P22 shown in the embodiment are not equal to each other, the pitch P21 and the pitch P22 are both n times of the pitch P1 between the adjacent light emitting units 200. In detail, the pitch P21 shown in FIG. 2 is 1 times (n=1) of the pitch P1 between the adjacent light emitting units 200, and the pitch P22 shown in FIG. 2 is 2 times (n=2) of the pitch P1 between the adjacent light emitting units 200. In addition, n in the relational expression between the pitch P2 and the pitch P1 shown in FIG. 2 may also be a positive integer other than 1 or 2, which will not be repeated.

Figure 3:
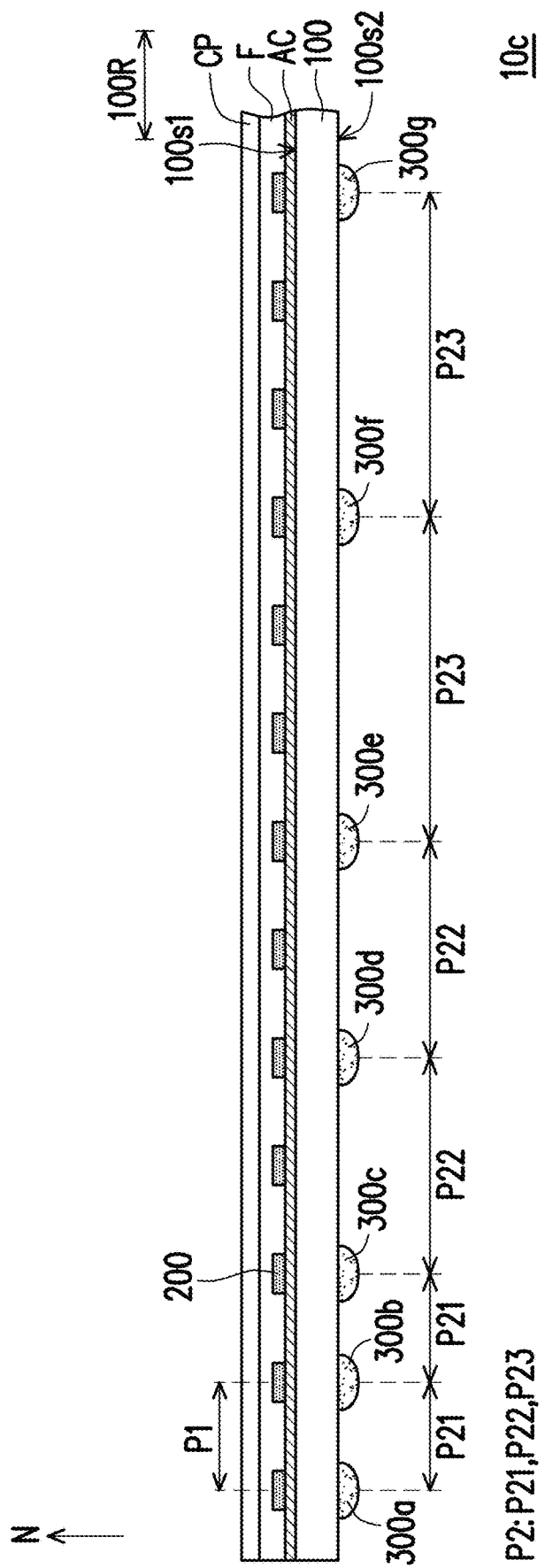
FIG. 3 is a schematic partial cross-sectional view of an electronic device according to a third embodiment of the disclosure.

FIG. 3 is a schematic partial cross-sectional view of an electronic device according to a third embodiment of the disclosure. It should be noted that the embodiment of FIG. 3 may adopt the component referential numbers and a part of the content of the embodiment of FIG. 1, where the same or similar reference numerals are used to represent the same or similar components, and description of the same technical content is omitted.

Figure 6:
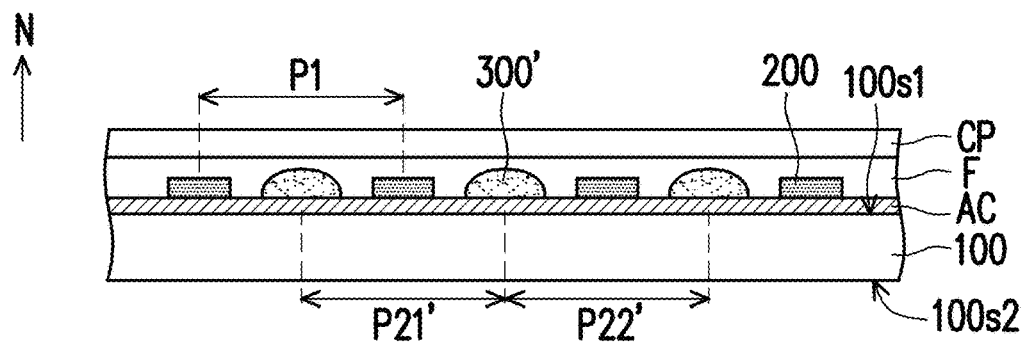
FIG. 6 is a schematic partial cross-sectional view of an electronic device according to a seventh embodiment of the disclosure.

One of the differences between an electronic device 10c of FIG. 3 and the aforementioned electronic devices 10a is that the farther away the supporting elements 300 are from a region 100R of the circuit board (not shown), the greater the density of the supporting elements 300 is. In some embodiments, the flexible substrate 100 may include the region 100R configured with a circuit board, where the circuit board is located on one side of the flexible substrate 100. The circuit board may, for example, include a rigid circuit board or a flexible circuit board. For example, the circuit board may be a flexible printed circuit board (FPC), but the disclosure is not limited thereto. In addition, the circuit board may further include a driving chip (not shown) and a connector (not shown), but the disclosure is not limited thereto. As shown in FIG. 3, there is a pitch P21 between the supporting element 300a and the supporting element 300b and between the supporting element 300b and the supporting element 300c, there is a pitch P22 between the supporting element 300c and the supporting element 300d and between the supporting element 300d and the supporting element 300e, and there is a pitch P23 between the supporting element 300e and the supporting element 300f and between the supporting element 300f and the supporting element 300g, where the supporting element 300g, the supporting element 300f, the supporting element 300e, the supporting element 300d, the supporting element 300c, the supporting element 300b and the supporting element 300a are sequentially disposed to depart from the region 100R configured with the circuit board (not shown). In the embodiment, the pitch P21 may be 1 times (n=1) of the pitch P1 between the adjacent light emitting units 200, the pitch P22 may be 2 times (n=2) of the pitch P1 between the adjacent light emitting units 200, and the pitch P23 may be 3 times (n=3) of the pitch P1 between the adjacent light emitting units 200. Based on the arrangement relationship between the supporting elements 300a to 300g described in the embodiment, a stress of the electronic device 10c may be reduced, thereby avoiding a problem of warping of the electronic device 10c of the embodiment. It should be noted that although the pitch P2 increased by 1 times each time (for example, the relationship between the pitch P21 and the pitch P22) is taken as an example for description, the disclosure is not limited thereto, i.e., the situation that the pitch P2 is increased by 2 times or more each time or the pitch P2 is increased by a different multiple each time is also applicable to the electronic device 10c of the disclosure. In some embodiments, in some embodiments, the above-mentioned region 100R may also be a region for fixing a mechanism (not shown) of the flexible substrate 100 mechanism (not shown), where the region for fixing the mechanism of the flexible substrate 100 may be located on one side of the flexible substrate 100. In some embodiments, the above-mentioned supporting elements 300a to 300g may also be disposed on the first surface 100s1 on the same side as the light emitting units 200 as shown in FIG. 6.

Figure 4:
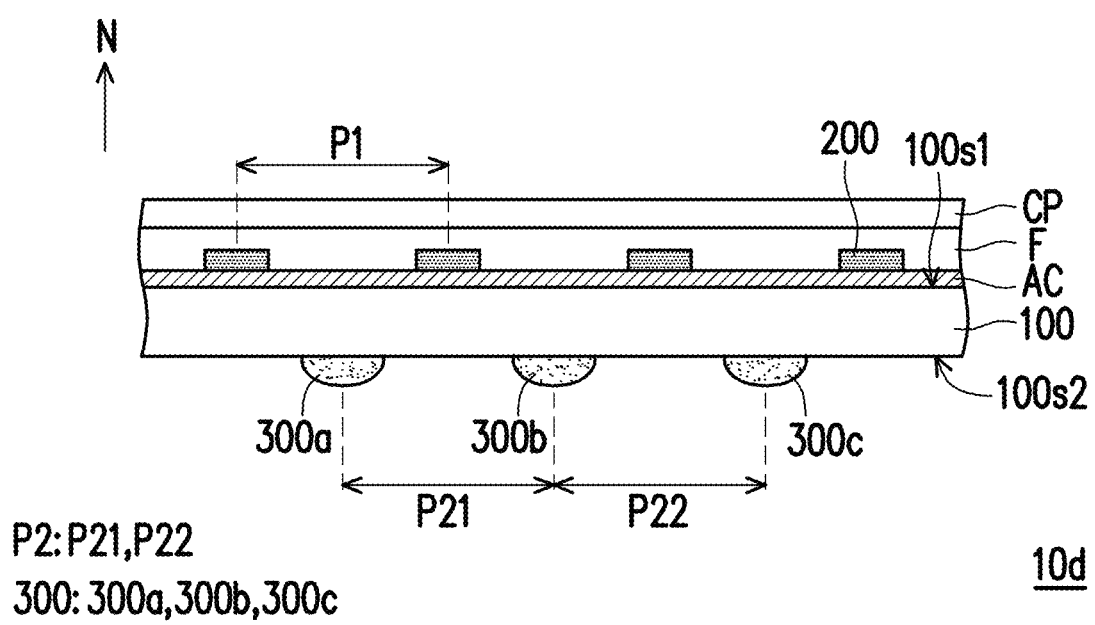
FIG. 4 is a schematic partial cross-sectional view of an electronic device according to a fourth embodiment of the disclosure.

FIG. 4 is a schematic partial cross-sectional view of an electronic device according to a fourth embodiment of the disclosure. It should be noted that the embodiment of FIG. 4 may adopt the component referential numbers and a part of the content of the embodiment of FIG. 1, where the same or similar reference numerals are used to represent the same or similar components, and description of the same technical content is omitted.

One of the differences between an electronic device 10d of FIG. 4 and the aforementioned electronic devices 10a is that at least one of the supporting elements 300 may not be overlapped with one of the light emitting units 200 in the normal direction N of the flexible substrate 100. In addition, although in the embodiment, the adjacent supporting elements of the supporting elements 300 may have equal pitches P2 (for example, the pitch P21 between the adjacent supporting elements 300a and 300b is equal to the pitch P22 between the adjacent supporting elements 300b and 300c), and the pitch P2 may be 1 times (n=1) of the pitch P1 between the adjacent light emitting units 200, but the disclosure is not limited thereto. In some embodiments, the adjacent supporting elements in the supporting elements 300 may also have unequal pitches P2; or n in the relational expression between the pitch P2 and the pitch P1 may also be a positive integer other than 1, and details thereof are not repeated. In some embodiments, each of the supporting elements 300 may not be overlapped with one of the light emitting units 200 in the normal direction N of the flexible substrate 100.

Figure 5A:
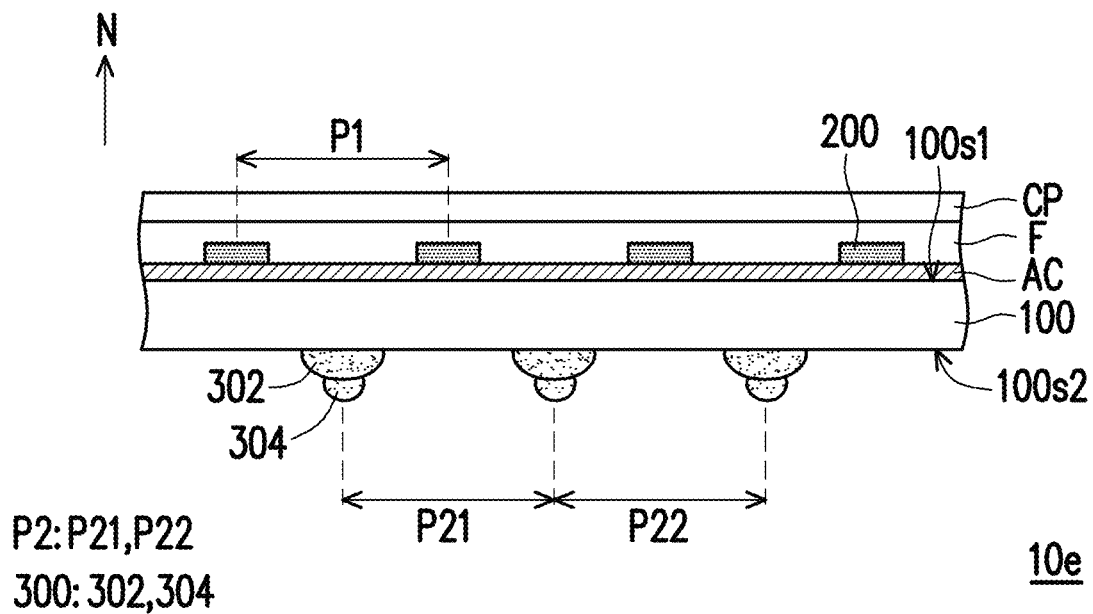
FIG. 5A is a schematic partial cross-sectional view of an electronic device according to a fifth embodiment of the disclosure.
Figure 5B:
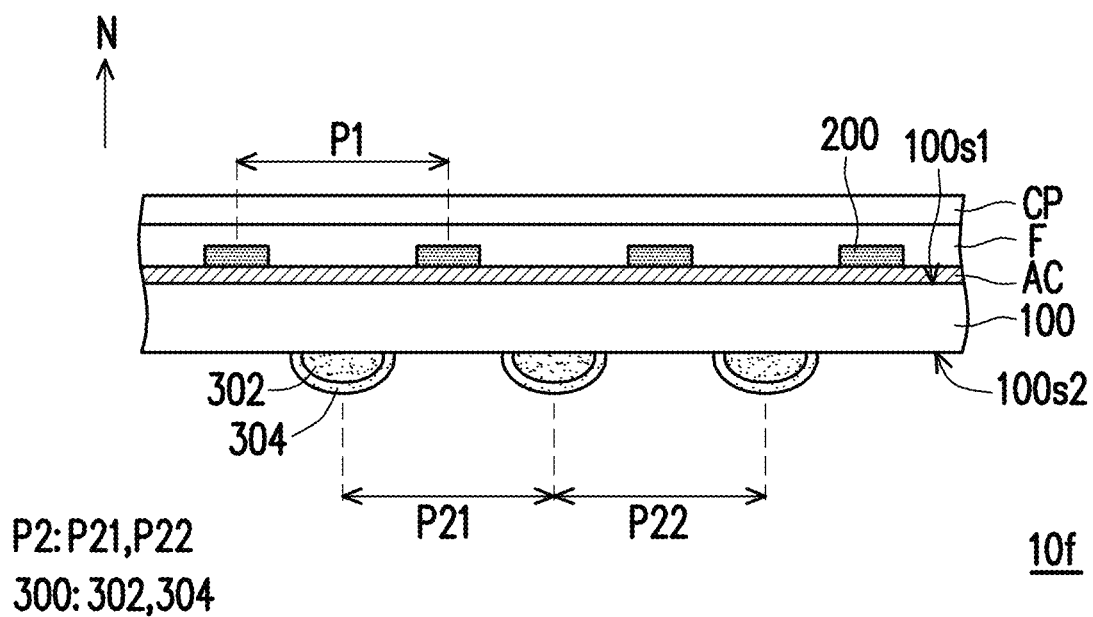
FIG. 5B is a schematic partial cross-sectional view of an electronic device according to a sixth embodiment of the disclosure.

FIG. 5A is a schematic partial cross-sectional view of an electronic device according to a fifth embodiment of the disclosure, and FIG. 5B is a schematic partial cross-sectional view of an electronic device according to a sixth embodiment of the disclosure. It should be noted that the embodiments of FIG. 5A and FIG. 5B may adopt the component referential numbers and a part of the content of the embodiment of FIG. 4, where the same or similar reference numbers are used to represent the same or similar elements, and the description of the same technical content is omitted.

One of the differences between an electronic device 10e of FIG. 5A and an electronic device 10f of FIG. 5B and the aforementioned electronic device 10d is that the supporting elements 300 respectively include a multilayer structure. As shown in FIG. 5A, the supporting elements 300 in the electronic device 10e respectively include a first supporting element 302 and a second supporting element 304, where a width of the first supporting element 302 is greater than a width of the second supporting element 304, and the first supporting element 302 may be located between the second supporting element 304 and the flexible substrate 100. The first supporting element 302 and the second supporting element 304 in the electronic device 10e may be sequentially disposed on the second surface 100s2 of the flexible substrate 100, where the second supporting element 304 is, for example, in contact with the first supporting element 302 but is not in contact with the second surface 100s2 of the flexible substrate 100, but the disclosure is not limited thereto. As shown in FIG. 5B, the supporting elements 300 in the electronic device 10f may respectively include a first supporting element 302 and a second supporting element 304, where the width of the first supporting element 302 is smaller than the width of the second supporting element 304, and the second supporting element 304 covers the first supporting element 302. The first supporting element 302 and the second supporting element 304 in the electronic device 10f may be sequentially disposed on the second surface 100s2 of the flexible substrate 100, and since the width of the second supporting element 304 is greater than the width of the first supporting element 302, the second supporting element 304 may, for example, wrap the first supporting element 302, and may be in contact with the second surface 100s2 of the flexible substrate 100, but the disclosure is not limited thereto.

In addition, in the embodiment, although the adjacent supporting elements of the supporting elements 300 have the same pitch P2, and the pitch P2 is 1 times (n=1) of the pitch P1 between the adjacent light emitting units 200, the disclosure is not limited thereto. In some embodiments, the adjacent supporting elements in the supporting elements 300 may also have unequal pitches P2; or n in the relational expression between the pitch P2 and the pitch P1 may also be a positive integer other than 1, which will not be repeated.

FIG. 6 is a schematic partial cross-sectional view of an electronic device according to a seventh embodiment of the disclosure. It should be noted that the embodiment of FIG. 6 may adopt the component referential numbers and a part of the content of the embodiment of FIG. 1, where the same or similar reference numerals are used to represent the same or similar components, and description of the same technical content is omitted.

One of the differences between an electronic device 10g of FIG. 6 and the aforementioned electronic devices 10d is that the supporting elements in the electronic device 10g may be disposed on the first surface 100s1 of the flexible substrate 100, i.e., the light emitting units 200 and a plurality of supporting elements 300' are all disposed on the first surface 100s1 of the flexible substrate 100, and at least one of the supporting elements 300' is located between the adjacent light emitting units 200. In some embodiments, the filling layer F covers the light emitting units 200 and the supporting elements 300', but the disclosure is not limited thereto. In addition, in the embodiment, although the adjacent supporting elements of the supporting elements 300' have an equal pitch P2' (for example, a pitch P21' is equal to a pitch P22'), and the pitch P2' is 1 times (n=1) of the pitch P1 between the adjacent light emitting units 200, the disclosure is not limited thereto. In other embodiments, the adjacent supporting elements in the supporting elements 300' may also have unequal pitches P2'; or n in the relational expression between the pitch P2' and the pitch P1 may also be a positive integer other than 1, and details thereof are not repeated. In some embodiments, each of the supporting elements 300 may be located between the adjacent light emitting units 200.

Figure 7A:
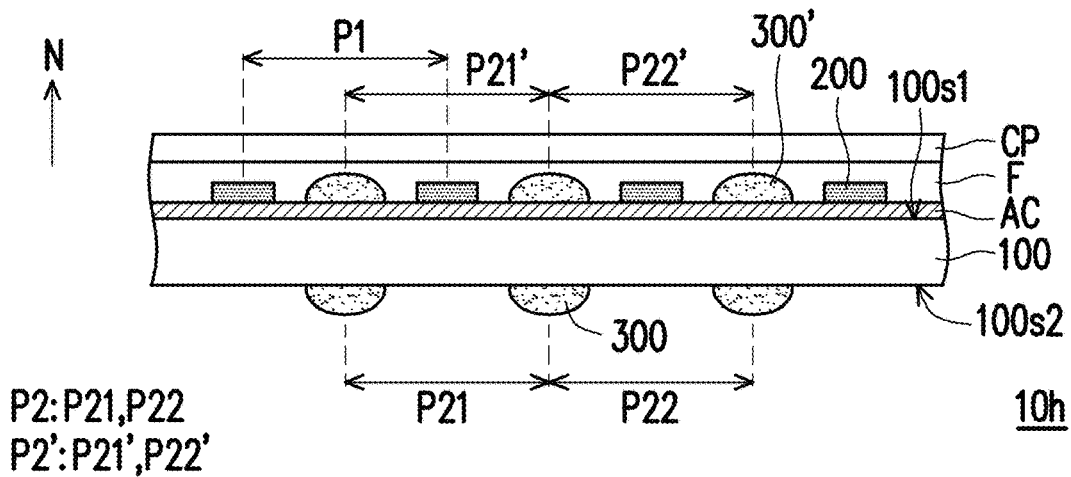
FIG. 7A is a schematic partial cross-sectional view of an electronic device according to an eighth embodiment of the disclosure.
Figure 7B:
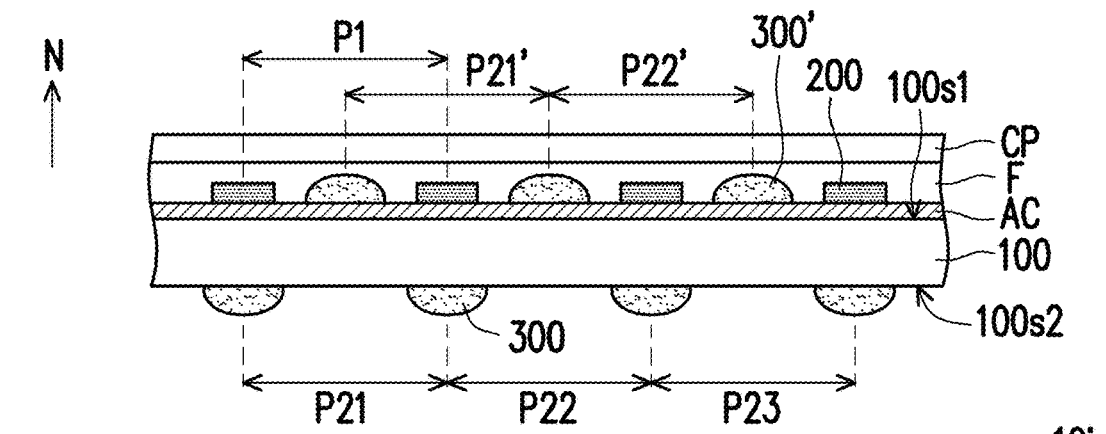
FIG. 7B is a schematic partial cross-sectional view of an electronic device according to a ninth embodiment of the disclosure.

FIG. 7A is a schematic partial cross-sectional view of an electronic device according to an eighth embodiment of the disclosure, and FIG. 7B is a schematic partial cross-sectional view of an electronic device according to a ninth embodiment of the disclosure. It should be noted that the embodiments of FIG. 7A and FIG. 7B may adopt the component referential numbers and a part of the content of the embodiment of FIG. 6, where the same or similar reference numerals are used to represent the same or similar components, and description of the same technical content is omitted.

One of the differences between an electronic device 10h of FIG. 7A and an electronic device 10i of FIG. 7B and the aforementioned electronic device 10g is that both of the electronic device 10h and the electronic device 10i further include the supporting elements 300 disposed on the second surface 100s2 of the flexible substrate 100. As shown in FIG. 7A, the electronic device 10h includes the supporting elements 300' disposed on the first surface 100s1 of the flexible substrate 100 and the supporting elements 300 disposed on the second surface 100s2 of the flexible substrate 100, and the supporting elements 300 and the supporting elements 300' are, for example, configured corresponding to each other. As shown in FIG. 7B, the electronic device 10i also includes the supporting elements 300 disposed on the second surface 100s2 of the flexible substrate 100 and the supporting element 300' disposed on the first surface 100s1 of the flexible substrate 100, the supporting elements 300 and the supporting elements 300' are, for example, disposed in a staggered manner with each other, and the supporting elements 300 in the electronic device 10i may be, for example, disposed corresponding to the light emitting units 200. In some embodiments, the supporting elements 300 disposed on the second surface 100s2 also have the equal pitch P2 (for example, the pitch P21 is equal to the pitch P22).

In some embodiments, the adjacent supporting elements in the supporting elements 300 and the adjacent supporting elements in the supporting elements 300' respectively have the equal pitch P2 and the equal pitch P2', and the pitch P2 and pitch P2' are all 1 times (n=1) of the pitch P1 between the adjacent light emitting units 200, but the present disclosure is not limited thereto. In some embodiments, the adjacent supporting elements in the supporting elements 300 and the adjacent supporting elements in the supporting elements 300' may also respectively have unequal pitches P2 and P2' there between; or n in the relational expression between the pitch P2 and the pitch P1 and between the pitch P2' and the pitch P1 may also be a positive integer other than 1, and details thereof are not repeated.

Figure 8:
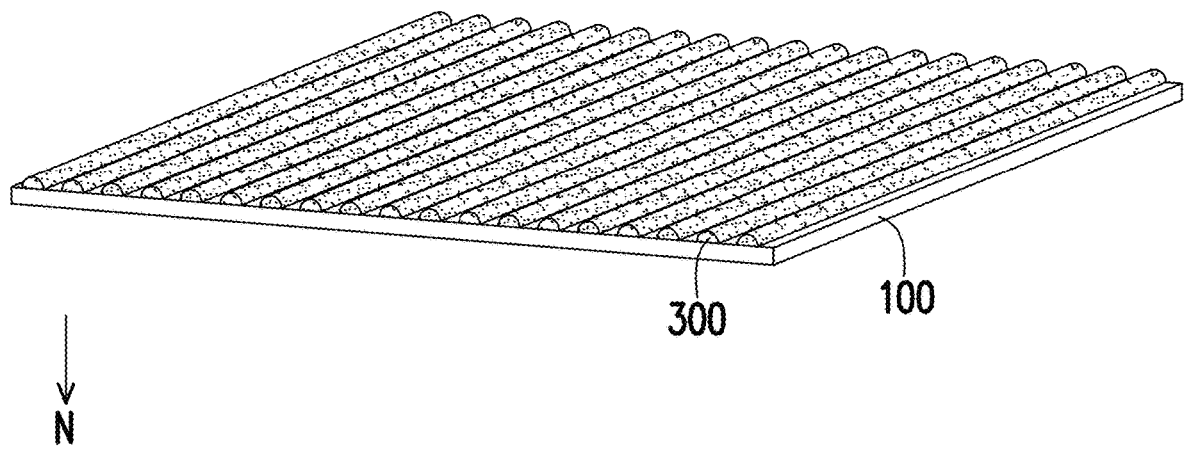
FIG. 8 is a schematic three-dimensional view of supporting elements in an electronic device according to some embodiments of the disclosure.

FIG. 8 is a schematic three-dimensional view of supporting elements in an electronic device according to some embodiments of the disclosure, and FIG. 9A to FIG. 9L are schematic top views of supporting elements in the electronic device of each embodiment of the disclosure.

Figure 9A:
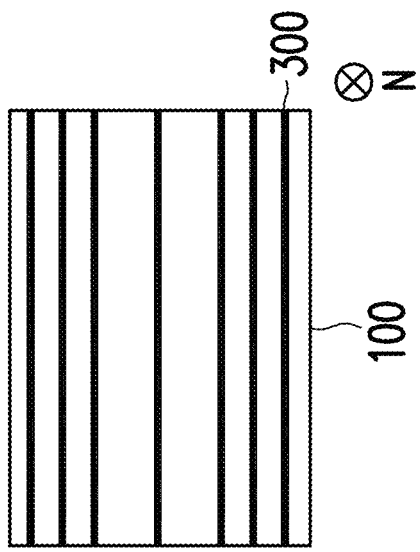
FIG. 9A to FIG. 9L are schematic top views of supporting elements in the electronic device of each embodiment of the disclosure.
Figure 9B:
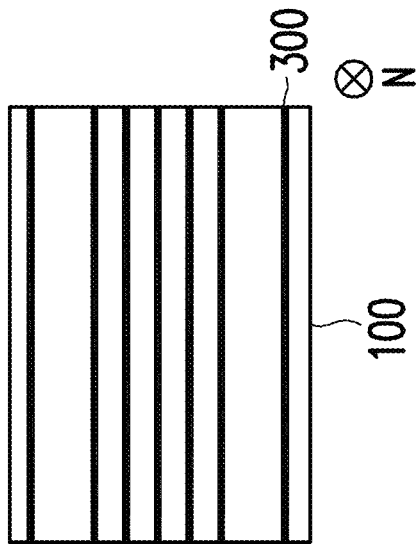
Figure 9C:
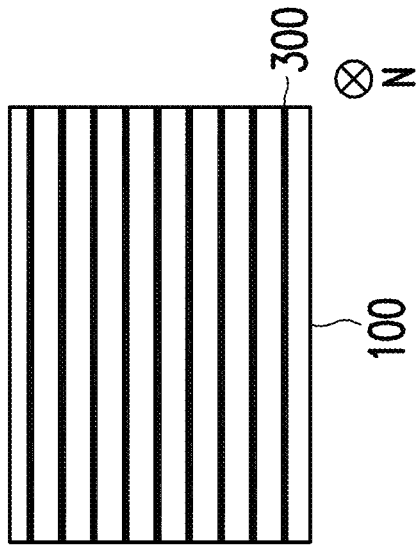
Figure 9D:
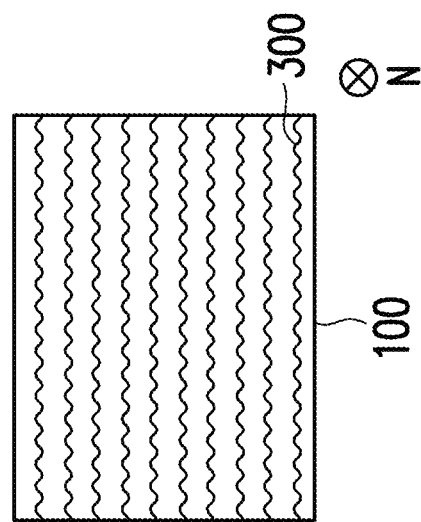
Figure 9E:
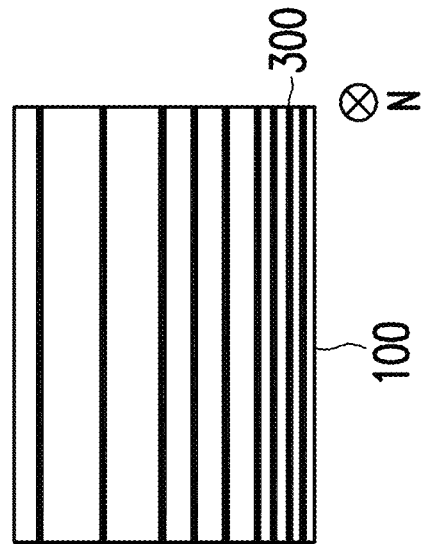
Figure 9F:
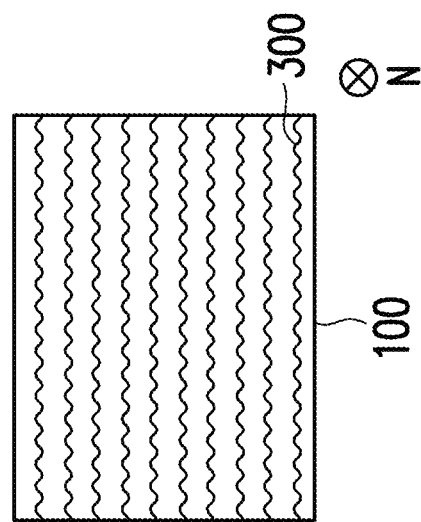
Figure 9G:
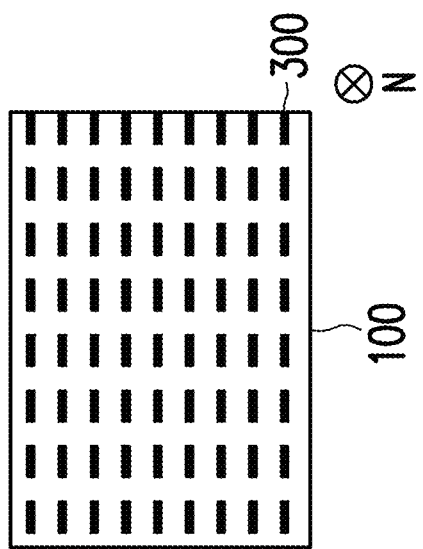
Figure 9H:
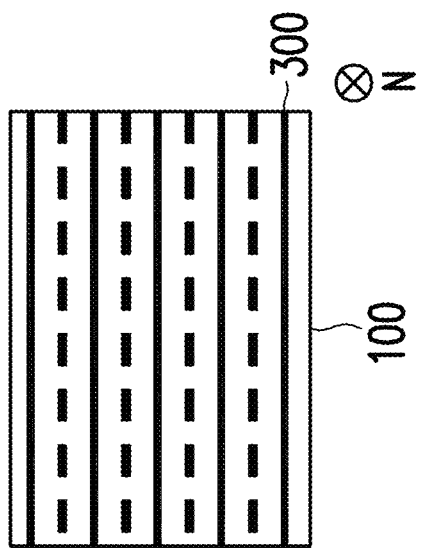
Figure 9I:
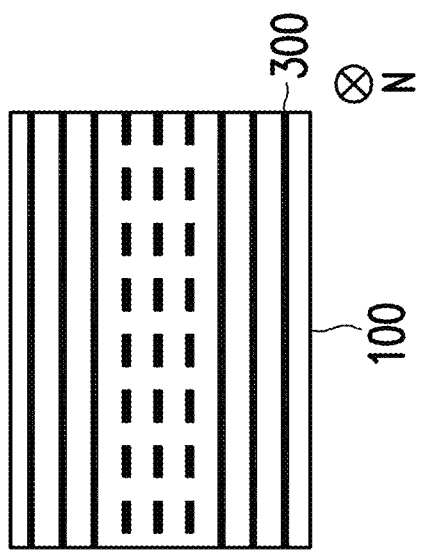
Figure 9J:
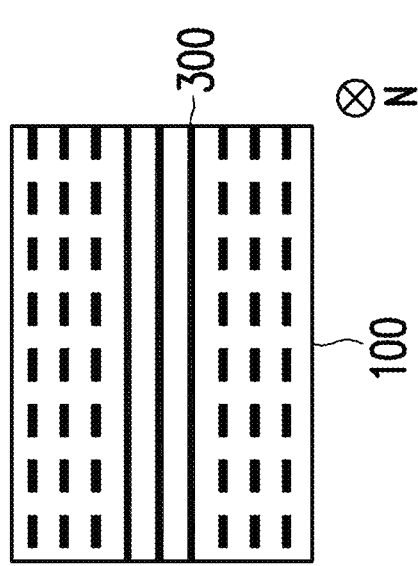
Figure 9K:
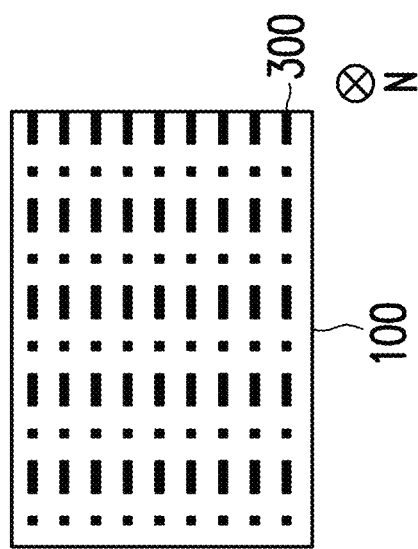
Figure 9L:
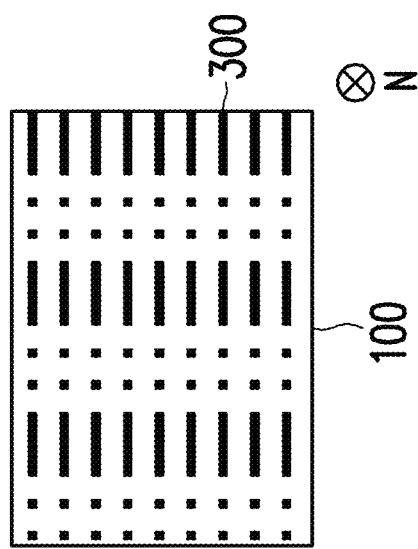

In FIG. 8 and FIG. 9A to FIG. 9L, the supporting elements 300 respectively have an arc-shaped structure, where the design of the arc-shaped structure may reduce a stress in the electronic device. The arc-shaped structures of the supporting elements 300 are, for example, arc-shaped structures as shown in FIG. 8, but the disclosure is not limited thereto. The arc-shaped structures included in the supporting elements 300 may, for example, have orthographic projections of a dot shape, a line shape, a wave shape or a combination thereof in the normal direction N of the flexible substrate 100, which is not limited by the disclosure. For example, FIG. 9A to FIG. 9D show that the supporting elements 300 have orthographic projections of the line shape in the normal direction N of the flexible substrate 100, FIG. 9F shows that the supporting elements 300 have orthographic projections of the wave shape in the normal direction N of the flexible substrate 100, FIG. 9G shows that the supporting elements 300 have orthographic projections of a dash line shape in the normal direction N of the flexible substrate 100, FIG. 9H to FIG. 9J show that the supporting elements 300 have orthographic projections of a combination of the line shape and the dash line shape in the normal direction N of the flexible substrate 100, FIG. 9K shows that the supporting elements 300 have orthographic projections of a one-dot chain line shape in the normal direction N of the flexible substrate 100, and FIG. 9L shows that the supporting elements 300 have orthographic projections of a two-dot chain line shape in the normal direction N of the flexible substrate 100. Moreover, although the above embodiments all show that the supporting elements 300 are disposed in a display region of the electronic device, the supporting elements 300 may also be disposed in a non-display region of the electronic device 10a, i.e., the supporting elements 300 may be formed, for example, in a line shape pattern that strides over the display region and the non-display region in the normal direction N of the flexible substrate 100, but the disclosure is not limited thereto. In addition, although FIG. 9A to FIG. 9L show that the supporting elements 300 are disposed on one surface of the flexible substrate 100, it should be noted that the supporting elements 300 may be selectively disposed on the two surfaces of the flexible substrate 100 as shown in the aforementioned embodiment, and details thereof are not repeated.

Figure 10:
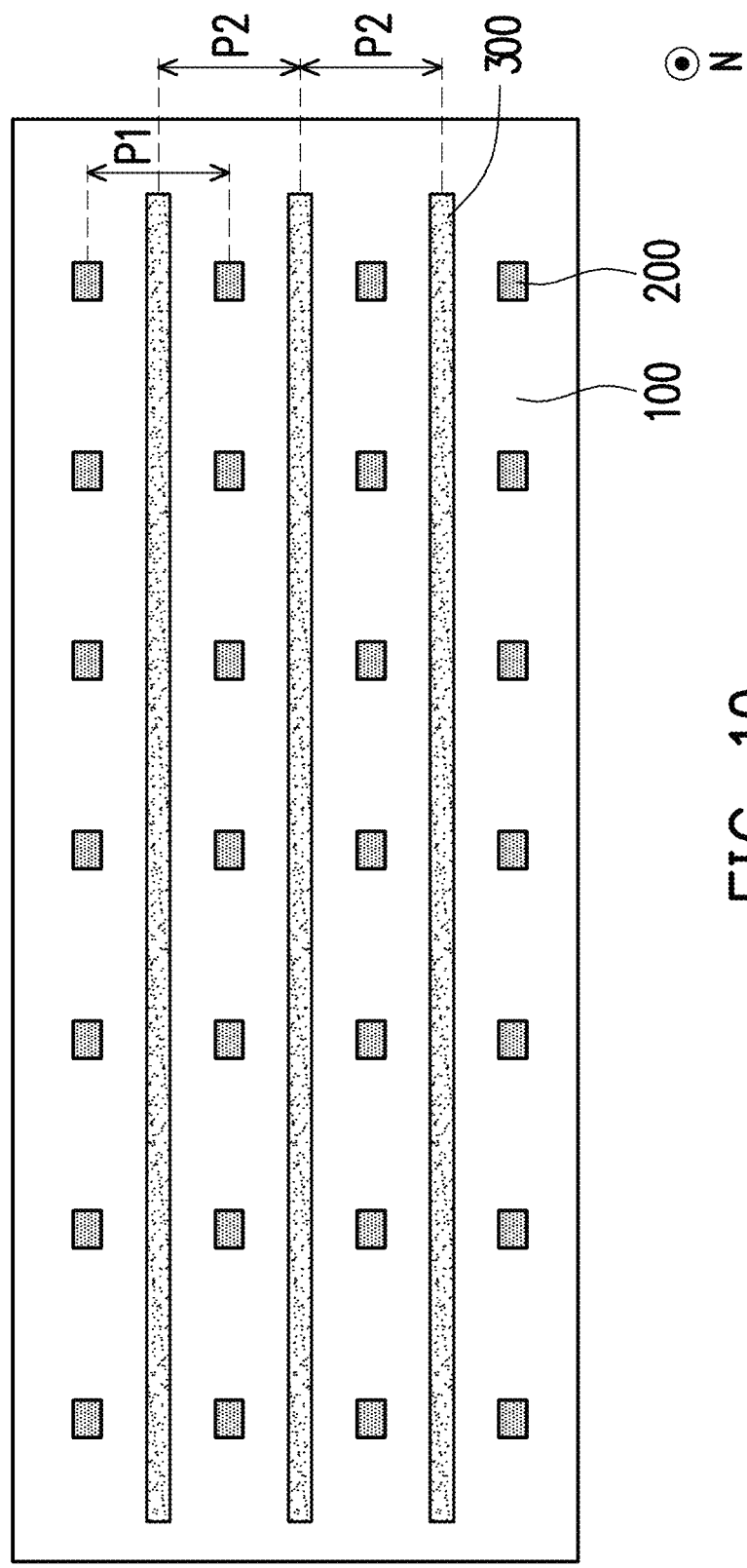
FIG. 10 is a schematic top view of an electronic device according to some embodiments of the disclosure.

FIG. 10 is a schematic top view of an electronic device according to some embodiments of the disclosure.

FIG. 10 shows that at least one of the supporting elements 300 has an orthographic projection of the line shape in the normal direction N of the flexible substrate 100, and at least one of the supporting elements 300 is not overlapped with one of the light emitting units 200 in the normal direction N of the flexible substrate 100, but the disclosure is not limited thereto. In addition, although the adjacent supporting elements in the supporting elements 300 of the embodiment have the same pitch P2, and the pitch P2 is 1 times (n=1) of the pitch P1 between the adjacent light emitting units 200, the disclosure is not limited thereto. In some embodiments, the adjacent supporting elements in the supporting elements 300 may also have unequal pitches P2; or n in the relational expression between the pitch P2 and the pitch P1 may also be a positive integer other than 1, which will not be repeated.

In summary, in the embodiments of the disclosure, a plurality of supporting elements are configured in the electronic device, which may reduce the influence of internal stress or external stress of the electronic device, and may reduce the damage of the electronic components therein.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents. The features between the embodiments may be mixed and matched arbitrarily as long as they do not violate or conflict with the spirit of the disclosure.

What is claimed is:

1. An electronic device, comprising:
   a substrate, having a first surface and comprising a region connected with a circuit board;
   a circuit structure, disposed on the first surface;
   two adjacent first supporting elements, disposed on the first surface and separated by a first distance;
   another two adjacent first supporting elements, disposed on the first surface and separated by a second distance; and
   two adjacent second supporting elements separated by a third distance, wherein the two adjacent second supporting elements and the two adjacent first supporting elements are respectively disposed on opposite sides of the substrate, and the two adjacent second supporting elements and the another two adjacent first supporting elements are respectively disposed on the opposite sides of the substrate,
   wherein the two adjacent first supporting elements are farther away from the region than the another two adjacent first supporting elements, and the first distance is less than the second distance, and at least one of the two adjacent second supporting elements is not overlapped with the two adjacent first supporting elements,
   wherein a top surface of the two adjacent first supporting elements has an arc shaped structure.

2. The electronic device as claimed in claim 1, wherein the circuit structure includes a plurality of scan lines, a plurality of data lines, an insulating layer, a capacitor, a plurality of transistors, and/or a plurality of electrodes.

3. The electronic device as claimed in claim 1, wherein a surface of the another two adjacent first supporting elements comprise an arc shaped structure.

4. The electronic device as claimed in claim 1, wherein the substrate further comprises a second surface opposite to the first surface, wherein a support layer and/or a heat dissipation layer disposed on the second surface.

5. The electronic device as claimed in claim 1, further comprising a plurality of light emitting units disposed on the first surface, wherein the plurality of light emitting units are electrical connected to the circuit structure.

6. The electronic device as claimed in claim 5, wherein the plurality of light emitting units comprise a self-luminous material or a non-self-luminous material.

7. The electronic device as claimed in claim 5, further comprising a filling layer disposed on the first surface of the substrate, wherein the filling layer covers the plurality of light emitting units.

8. The electronic device as claimed in claim 7, further comprising a cover plate disposed on the filling layer, wherein the cover plate at least partially covers the plurality of light emitting units.

9. The electronic device as claimed in claim 5, wherein one of the two adjacent first supporting elements is located between two adjacent light emitting units.

10. The electronic device as claimed in claim 1, wherein the circuit board comprises a rigid circuit board or a flexible circuit board.

11. The electronic device as claimed in claim 1, wherein the two adjacent first supporting elements have orthographic projections of a dot shape, a line shape, a wave shape or a combination thereof in a normal direction of the substrate.

* * * * *